(12) United States Patent
Bakalski et al.

(10) Patent No.: US 7,782,133 B2
(45) Date of Patent: Aug. 24, 2010

(54) POWER AMPLIFIER WITH OUTPUT POWER CONTROL

(75) Inventors: Winfried Bakalski, Munich (DE);
Markus Zannoth, Neubiberg (DE)

(73) Assignee: Infineon Technologies AG, Neubiberg (DE)

( * ) Notice: Subject to any disclaimer, the term of this patent is extended or adjusted under 35 U.S.C. 154(b) by 77 days.

(21) Appl. No.: 12/203,692

(22) Filed: Sep. 3, 2008

(65) Prior Publication Data

US 2010/0052789 A1   Mar. 4, 2010

(51) Int. Cl.
*H03G 3/20*   (2006.01)
(52) U.S. Cl. ..................................................... 330/133
(58) Field of Classification Search .................. 330/133, 330/285
See application file for complete search history.

(56) References Cited

U.S. PATENT DOCUMENTS

| 6,259,901 | B1 * | 7/2001 | Shinomiya et al. | 455/127.3 |
| 6,822,511 | B1 * | 11/2004 | Doherty et al. | 330/133 |
| 7,605,651 | B2 * | 10/2009 | Ripley et al. | 330/133 |

* cited by examiner

*Primary Examiner*—Steven J Mottola
(74) *Attorney, Agent, or Firm*—Lee & Hayes, PLLC

(57) ABSTRACT

This disclosure relates systems and methods for a power amplifier with output power control. The power amplifier can include multiple stages of amplification. An RF signal is fed to the power amplifier with output control that amplifies the power of the RF signal to meet operational requirements. A first stage of the power amplifier controls the output power via voltage regulation. An isolating device is introduced in the transmission path of the RF signal between the first stage and the following stages of the power amplifier. The isolating device ensures that the load impedance of the first stage remains fixed at a constant value.

19 Claims, 6 Drawing Sheets

POWER AMPLIFIER WITH OUTPUT POWER CONTROL

BACKGROUND

Generally, in mobile communication devices based on systems such as GSM (Global System for Mobile Communication), EDGE (Enhanced Data Rates for GSM Evolution), DECT (Digital Enhanced (formerly European) Cordless Telecommunications), etc., the output power of transmitters is adjusted to reduce power consumption and minimize interference with other signals. The adjustments in the output power are usually performance in accordance with pre-defined standards that govern the implementation of such systems. For example, GSM specifications list nominal output power levels, and accepted tolerances of GSM mobile transmitters under various operating conditions. In existing systems, the output power is adjusted by regulating either the operating voltage or the quiescent current in a power amplifier.

Control of output power by regulating the operating voltage depends on the load impedance of the power amplifier. The load impedance should be maintained at a constant value for effective power control; however, in general, the load impedance may be susceptible to variations. For example, if a cell phone is placed on a metallic object, the antenna of the cell phone may pick up some noise, causing variations in load impedance of the power amplifier inside the cell phone. Power control rising voltage regulation is typically most effective when the power amplifier operates in the saturation region. In some systems, such as GSM and DECT systems, the power amplifier operates in the saturation region, while in other systems, such as EDGE, 3G (WCDMA), Wireless LAN, the power amplifier operates in the linear region. Therefore, power control by voltage regulation cannot be used effectively in all systems.

Output power control by regulating quiescent current involves adjusting the quiescent current to change the output power. This approach works well for small outputs since the current consumption is low; however, there remain issues related to transistor parameters, temperature, and dependence on input power.

BRIEF DESCRIPTION OF THE DRAWINGS

The detailed description is described with reference to the accompanying figures. In the figures, the left-most digit(s) of a reference number identifies the figure in which the reference number first appears. The same numbers are used throughout the drawings to reference like features and components.

DETAILED DESCRIPTION

This disclosure is directed to techniques for power control in power amplifiers. More particularly, the techniques involve implementation of an output power amplifier with output power control. The disclosed power amplifier with power control can be implemented in a variety of communication devices or systems. For example, a power amplifier with output power control can be implemented in mobile phones, base stations, etc. The following systems and methods are described with reference to a mobile communication system; however, it will be appreciated that the disclosed power amplifier with power control can be implemented generally in any electronic communication system.

Mobile communication systems include components such as mobile communication devices, base stations, etc., that can receive input signals, modulate the input signals into RF signals, amplify the RF signals as per requirement, and transmit the amplified signal. The components include a power amplifier to amplify the RF signals and provide power efficiency.

The disclosed technique for implementing a power amplifier with power control involves a combination of voltage regulation and quiescent current regulation. The disclosed power amplifier includes multiple amplification stages. A first stage involves power control via voltage regulation while the later stages may involve power control via current regulation. In one implementation, voltage regulation is performed when a small part of the output is to be converted, such as in the first stage that generally accounts for a small share of the overall efficiency of the power amplifier. Following stages, which account for the maximum share of the overall efficiency, are controlled via quiescent current. In another implementation, one or more of the following stages may also be controlled by voltage regulation.

Exemplary System

Figure 1:
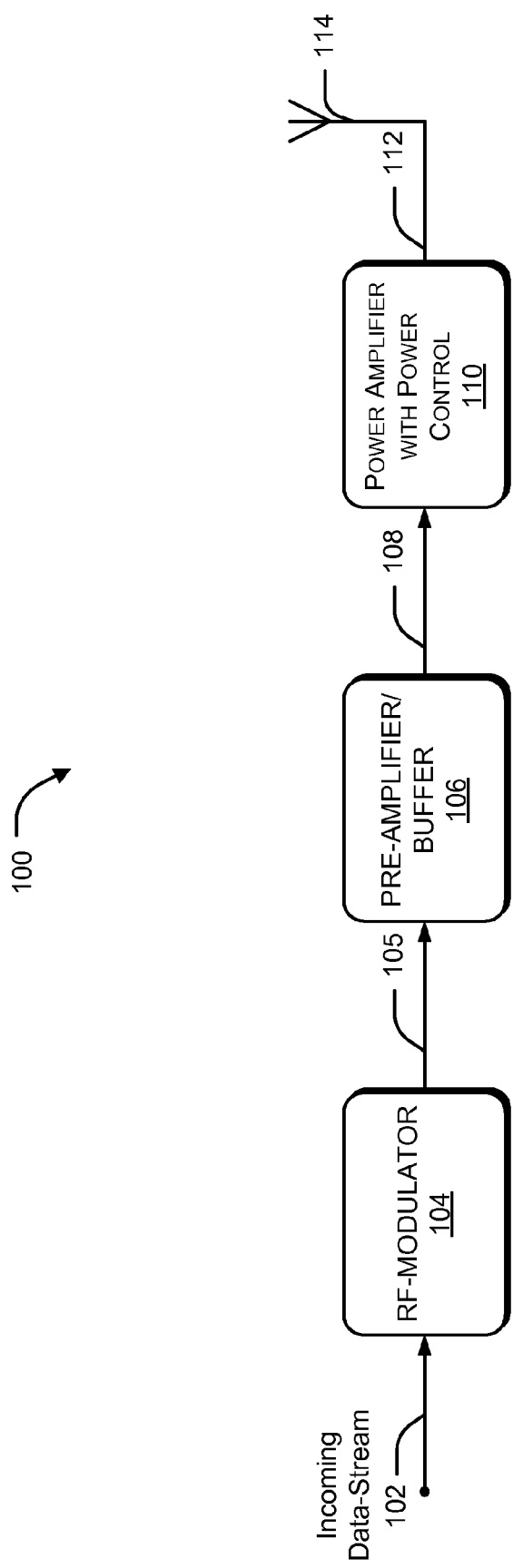
FIG. 1 is a block diagram illustrating an exemplary system including a power amplifier with power control.

FIG. 1 illustrates an exemplary system 100 including a power amplifier with power control. The order in which the blocks of the system are described is not intended to be construed as a limitation, and any number of the described system blocks can be combined in any order to implement the system, or an alternate system. Additionally, individual blocks may be deleted from the system without departing from the spirit and scope of the subject matter described herein. Furthermore, the system can be implemented in any suitable hardware, software, firmware, or a combination thereof, without departing from the scope of the invention.

The system 100 represents an RF (radio frequency) transmission section of a mobile communication device, such as a cell phone. The system 100 receives an input signal or incoming data-stream 102. The input signal 102 can correspond to voice data, text data, or audio-video data. The input signal 102 is passed to an RF-modulator 104.

The pre-amplifier and buffer 106 amplifies the modulated signal 105, making the RF input signal suitable for further processing. The pre-amplifier and buffer 106 can provide a (programmable) voltage gain to the input signal 105; however, the pre-amplifier and buffer 106 may not provide significant current gain. The pre-amplifier and buffer 106 can additionally provide electrical impedance transformation to the RF input signal (modulated signal) 105 and can be realized to have a programmable or variable gain (PGA) for systems requiring a high dynamic range for the output power levels such as 3G (UMTS). The amplified input signal is then sent to the power amplifier 110.

The RF modulator 104 converts the amplified signal into a radio frequency-modulated signal, or RF signal 105, where modulation conditions the amplified signal to be capable of being transmitted through free space. The RF signal 108 is then sent to a power amplifier with power control 110 or power amplifier 110.

The power amplifier 110 amplifies and increases the power efficiency of the RF signal 108. To provide variable power output depending upon the operating conditions, the power amplifier 110 can implement the disclosed techniques for power control.

In one implementation, the power amplifier 110 includes multiple stages of amplification. Each stage may be implemented with electronic components, such as transistors. The power control is achieved by voltage regulation in the first stage and by current regulation in the following stages. The power amplifier 110 includes an isolating device, for example as further described below, between the first stage and the second stage. The isolating device serves to maintain constant load impedance at the first stage by preventing return signals in the transmission path. For instance a 90°-Hybrid would be a device to maintain constant impedance. Therefore, by using the isolating device, the output of the first stage can be maintained a pre-defined value. After amplification by the power amplifier 110, the amplified RF signal output 112 is transmitted via an antenna 114.

Figure 2:
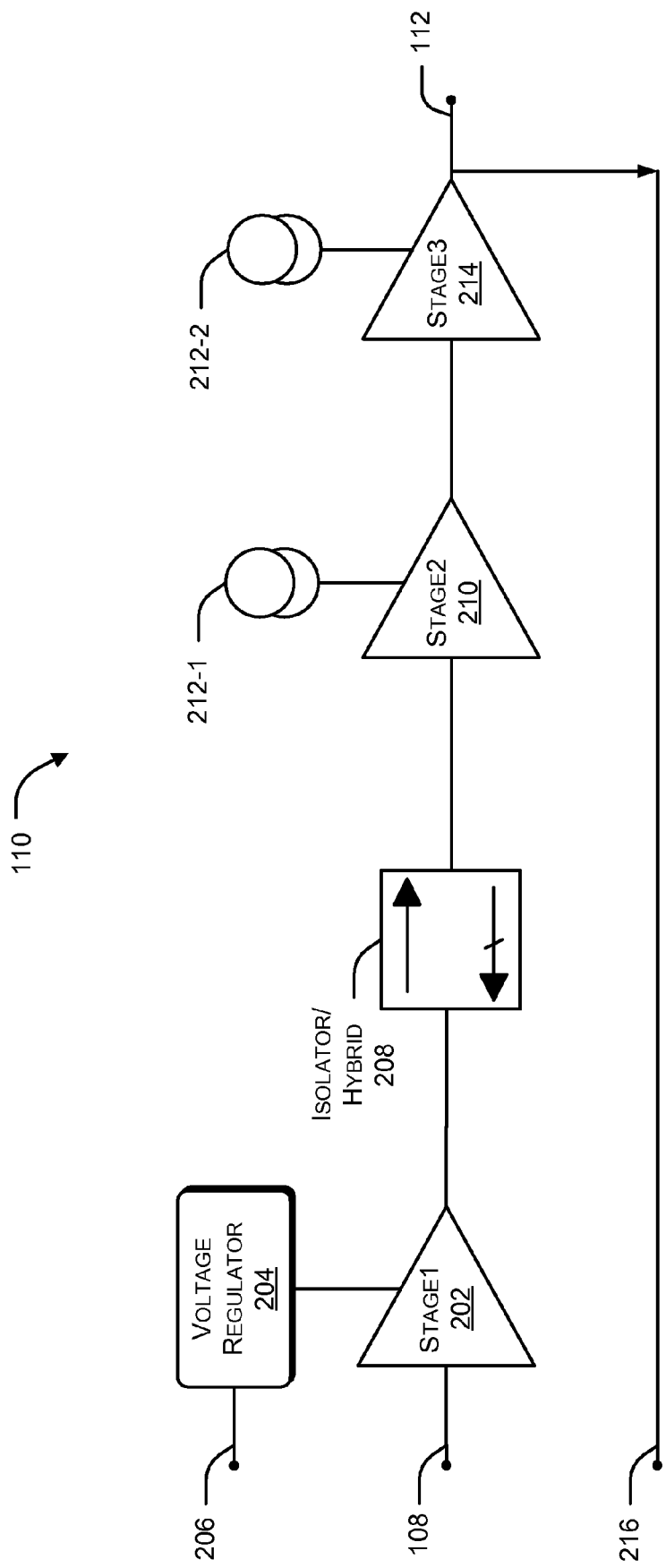
FIG. 2 is a block diagram illustrating an exemplary power amplifier with power control.

FIG. 2 illustrates a power amplifier 110 implemented in three stages according to one embodiment. The RF signal 108 is sent to stage1 202. The stage1 202 includes electronic components such as transistors, etc., for amplifying the RF signal 108. The stage1 202, which controls power via voltage regulation, may account for a small percentage, such as approximately 5%, of the overall efficiency of the power amplifier 110. The output power of the stage1 202 depends on the operating voltage of the stage1 202. A voltage regulator 204 regulates the operating voltage in accordance with a control voltage 206. The control voltage 206 can be supplied from any standard power source, e.g. a baseband processor output in mobile phone applications. The control voltage 206 can be set at a constant value, such as per an operating requirement. The voltage regulator 204 compares the operating voltage with the control voltage 206 and changes the operating voltage accordingly.

The output power of the stage1 202 can also vary with a change in load impedance of the electronic components in the stage1 202. The load impedance may vary if any noise or interference is received in the transmission path, such as from the antenna 114. To avoid noise or interference, an isolating device 208 (as discussed above) is introduced in the transmission path from the stage1 202 to the next stage. The isolating device 208 couples the power from the stage1 202 to the next stage, but isolates the stage1 202 from the signals coming from other stages of the power amplifier 110 and other components of system 100, such as the antenna 114. Therefore, the isolating device 208 can prevent variation in the load impedance due to retroactivity. The isolating device 208 can be implemented with the use of passive electronic components, such as transmission lines (90° branch line coupler, rat-race coupler), inductors (L-C bridge), transformers, circulators and isolating devices using anisotropic ferrites or other insolating elements. In an alternate embodiment, forced adjustments through resistors can also be made to keep the load impedance at a constant value. However resistors usually imply signal losses.

The RF signal 108 is sent to stage2 210 of the power amplifier 110. At stage2 210, current regulation may be used for power control. Stage2 210, which can include electronic components such as transistors, can receive a variable bias current via a variable current source 212-1. The control voltage 206 dictates the output of the variable current source 212-1. Therefore, depending upon the control voltage 206, the variable current source 212-1 regulates the bias current for the stage2 210. The RF signal 108 received from the stage1 202 may be amplified further and sent to stage3 214 of the power amplifier 110.

At stage3 214, current regulation may again be used for power control. Stage3 214, which can include electronic components such as transistors, receives a variable bias current via a variable current source 212-2. In one implementation, the variable current source 212-2 can be same as the variable current source 212-1. The control voltage 206 dictates the output of the variable current source 212-2. Depending upon the control voltage 206, the variable current source 212-2 regulates the bias current for stage3 214. The RF signal 108 can be amplified furthermore at stage3 214 to meet the operating requirements of the system 100. The amplified RF signal 112 can then be transmitted via the antenna 114. The power level of the amplified RF signal 112 can be measured via a detector 216. If the power level does not meet an operating requirement of system 100, further adjustments can be made in the power amplifier 110.

The current sources 212-1 and 212-2 provide a minimum bias current, where the Stage2 210 and Stage3 214 are basically controlled by an RF input signal. The effect is that a certain RF level reaching an Ube voltage will be rectified by an Ube diode (not shown) of the RF transistor or stages 210 and 214, hence resulting in a so-called "self-bias". To avoid that this effect abruptly starts, and that device and temperature are dependent, the amplifier stages 210 and 214 gets a bias current to "smoothen" the change-over from Class-A to Class-B operation.

The result is that the RF output signal is almost fully controlled by the input signal which is very well defined by the isolating device output and the voltage regulated first stage. If a linear mode is required (e.g., EDGE), the bias can be increased to keep a power amplifier in Class-A mode.

Another advantage of regulating mainly the first stage with a follower circuit is that regulation works very fast (i.e., limited only by the transistor device speed and the control signal itself). There exist no "real" voltage regulator in terms of a feedback loop and an operational amplifier. The control current sets the voltage without looking for a feedback signal. This works best, if a bipolar transistor is used, giving a well defined relation between base and emitter. For example, In Silicon this is a 0.7V diode voltage plus the temperature dependence (~2 mV/K). In Germanium, this would be about 0.4V and in III/V materials (GaAs) typically voltages in the region of 1.3V. A set signal introduces less noise. Basically due to the much simpler circuitry, much less noisy elements such as current references, noisy transistors are found.

The regulation speed is independent of the control signal. In difference, a feedback using system usually uses a low-pass filter (RC Filter), which gets very slow when the current is reduced. The reason for this is physically that for a fixed capacitance, a reduced charge current leads to an increased charge time. Another advantage of the follower circuit is that there is no feedback loop, hence no instability due to positive feedback can occur. Considering power-time templates as defined for GSM System, the power regulation (time-template) may not be critical, even for low current modes.

Figure 3:
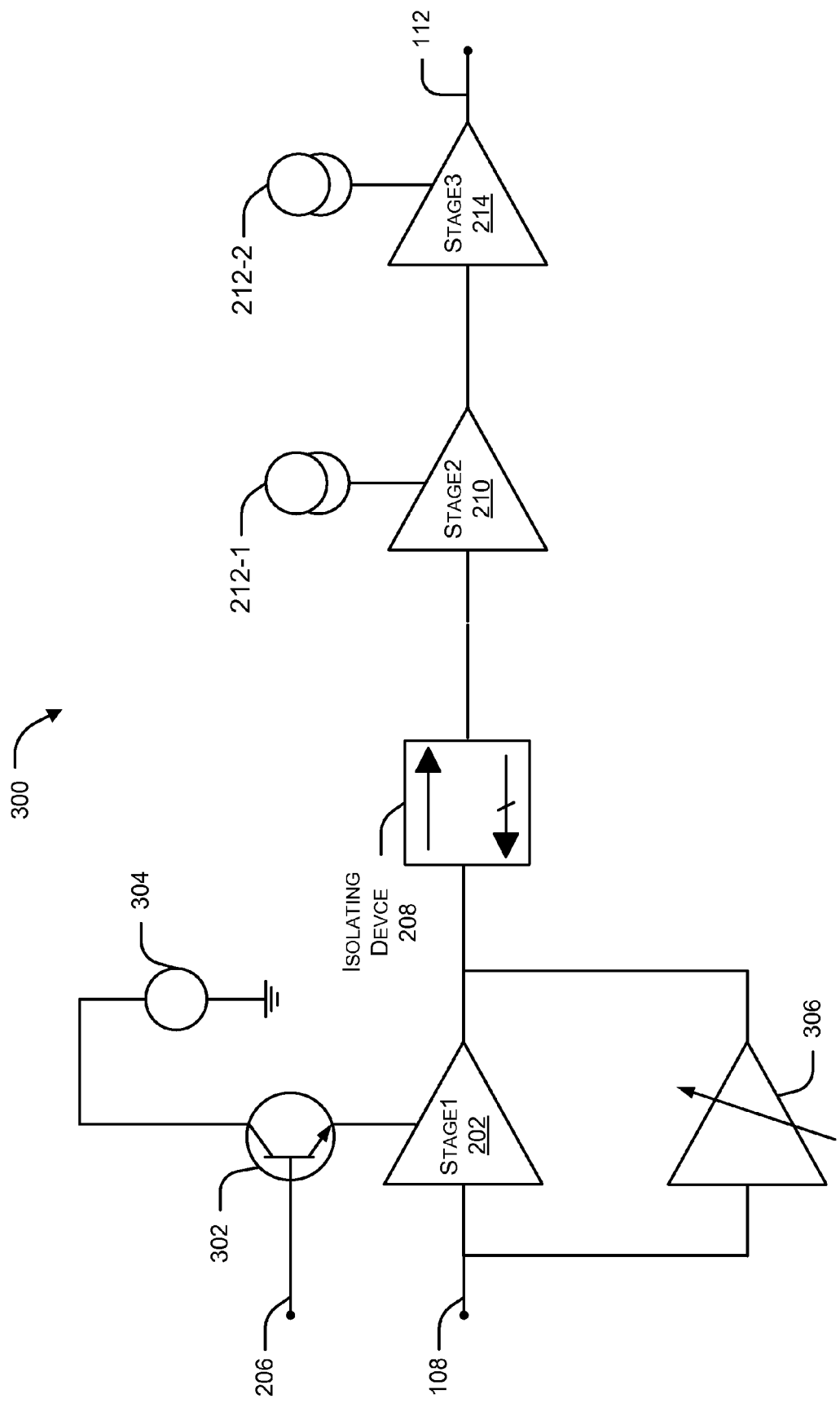
FIG. 3 is a block diagram illustrating an exemplary power amplifier with power control including a variable gain amplifier.

FIG. 3 illustrates an exemplary power amplifier 300 with power control including a variable gain amplifier. The power amplifier 300 may be another embodiment of the power amplifier 110. The power amplifier 300 can be used in systems where the power amplifier 110 is applicable. In the following description of the power amplifier 300, the components common to both the power amplifier 110 and the power amplifier 300 are referred to by the same names and reference numbers.

The power amplifier 300 receives the RF signal 108 for amplification. In the stage1 202, which includes electronic components such as transistors, the output power can be controlled by voltage regulation, or by using a variable gain amplifier (VGA)/programmable gain amplifier (PGA) based on the mode of operation of the stage1 202.

For example, in systems where the transistors in the stage1 202, operate in the saturation region, such as in the case of GSM systems, the output power can be controlled by voltage regulation. In such a case, the operating voltage of the stage1 202 may be regulated based on the control voltage 206. The control voltage 206 drives the base terminal of an NPN transistor 302. In one implementation, an N-channel MOSFET can be used in place of the NPN transistor (in P-Channnel for a PNP transistor). An advantage of using a emitter follower is that no feedback to an operational amplifier is required, as the emitter follows the base voltage Ube~0.7V (for Silicon) which can be generated by the current over a simple resistor. Alternatively, a voltage control loop can be implemented which is more accurate but has the disadvantage of every regulation, or a possible loop instability, slower response (i.e., swing in time), and noise. The emitter terminal of the transistor 302 can be connected to a transistor in the stage1 202. The collector terminal of the transistor 302 is connected to a DC source 304 for biasing of the transistor 302. The operating voltage at the stage1 202 is regulated with the use of the transistor 302.

In another example, in systems where transistors in stage1 202 operate in the linear region, such as in the case of EDGE systems, output power can be controlled by using a VGA/PGA. In such systems, a variable gain amplifier 306 can be used. The output power of the stage1 202 is then dependent on the gain of the variable gain amplifier 306. The gain of the variable gain amplifier 306 can be adjusted as needed to obtain the desired output power. The variable gain amplifier 306 can be implemented using transistors, operational amplifiers, and the like. The output of the stage1 202 may also depend on the load impedance of the stage1 202. The isolating device 208 ensures the consistency of the output by maintaining load impedance at a constant value, as described above. The RF signal 108 is sent to the stage2 210 and subsequently to the stage3 214.

At stage2 210, the power control may be performed by current regulation. Stage2 210, which includes electronic components such as transistors, receives a variable bias current via the variable current source 212-1. Control voltage 206 dictates the output of the variable current source 212-1. Depending upon the control voltage 206, the variable current source 212-1 regulates the bias current for the stage2 210. The RF signal 108 may again be amplified and sent to the stage3 214 of the power amplifier 300 for further amplification in the similar manner as performed in the stage2 210.

Figure 4:
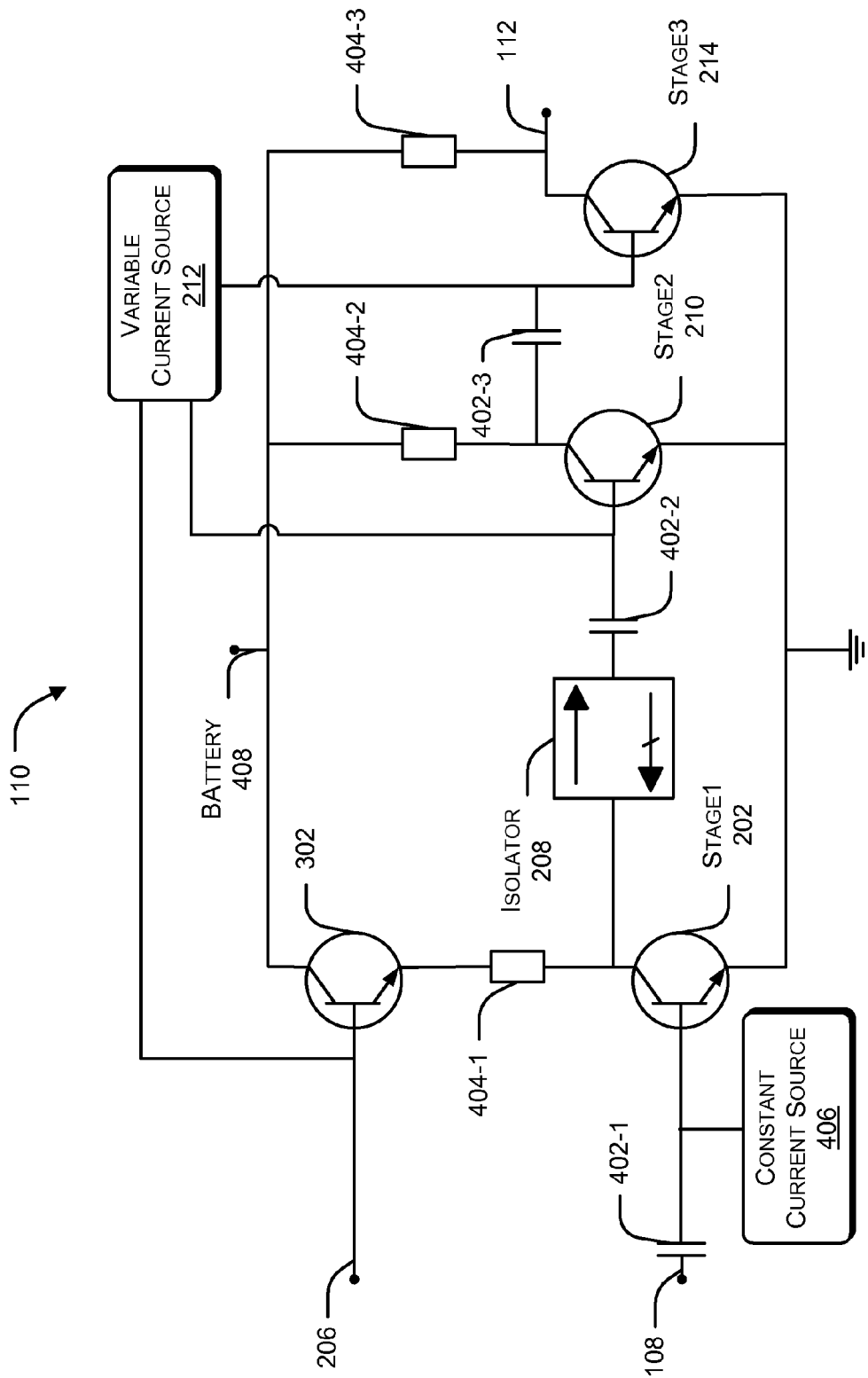
FIG. 4 is a block diagram illustrating a circuit diagram of an exemplary power amplifier with power control.

FIG. 4 illustrates an exemplary circuit diagram of the power amplifier 110. The circuit diagram intends to provide a basic conceptual description of the power amplifier 110 and does not limit the number of components present in the power amplifier 110. In the following description, the components common to FIG. 2 and FIG. 3 have been referred to by the same names and reference numbers.

The power amplifier 110 receives the RF signal 108, which goes through three stages of amplification. The power amplifier 110 can be implemented using various electronic components such as transistors, resistors, capacitors, current sources, power sources, etc. At stage1-202, the power amplifier 110 receives the RF signal 108 via a capacitor 402-1. The capacitor 402-1 can be a coupling capacitor that blocks DC signals that can be introduced in the path of the RF signal 108. The stage1 202 can include an NPN transistor 302 for providing amplification to the RF signal 108. In an implementation, an N-channel MOSFET can be used in place of the NPN transistor.

The transistor in the stage1 202 may operate in the saturated mode. The stage1 202 receives a constant current via a constant current source 406. The constant current source 406 is energized by a current source or battery 408 included in the power amplifier 110. The stage1 202 controls the output power by regulating the operating voltage of the transistor.

The NPN transistor 302 regulates the operating voltage in the stage1-202 via the control voltage 206. In an implementation, an N-channel MOSFET with low source-drain impedance can be used in place of the NPN transistor. The operating voltage may also depend on a load impedance 404-1 of the transistor in the stage1 202.

The load impedance 404-1 may be susceptible to variations due to retroactivity of other stages of the power amplifier 110. To avoid this, the isolating device 208 is introduced in the signal path between the stage1 202 and the stage2 210. The isolating device 208 allows the RF signal 108 to pass through to the stage2 210, but blocks any signal or noise from other stages to reach the stage2 210. Therefore, the isolating device 208 ensures that the load impedance 404-1 remains at a constant value, thereby avoiding any problem in voltage regulation. The RF signal 108 may be amplified at the stage1 202 and sent to the stage2 210 and stage3 214 for further amplification.

The stage2 210 receives the RF signal 108 by a capacitor 402-2. The capacitor 402-2 can be a coupling capacitor that blocks DC signals and isolates DC bias settings of the stage1 202 and stage2 210. The stage2 210 includes an NPN transistor with a load impedance 404-2 for amplification. In an implementation, an N-channel MOSFET can be used in place of the NPN transistor.

The stage2 210 can control the output power by current regulation. The variable current source 212 regulates the bias current of the transistor in stage2 210 in accordance with control voltage 206. After the amplification at the stage2 210, the resulting RF signal 108 is sent to the stage3 214.

Stage3 214 receives the RF signal 108 from the stage2 210 by a capacitor 402-3. The capacitor 402-3 can be a coupling capacitor that blocks DC signals and isolates DC bias settings of the stage2 210 and the stage3 214. The stage3 214 includes an NPN transistor with a load impedance 404-3 for amplification. In an implementation, an N-channel MOSFET can be used in place of the NPN transistor. The stage3 214 controls the output power by current regulation. The variable current source 212 regulates the bias current of the transistor in stage3 214 in accordance with the control voltage 206. After amplification, the amplified RF signal 112 is transmitted by the antenna 114.

Figure 5:
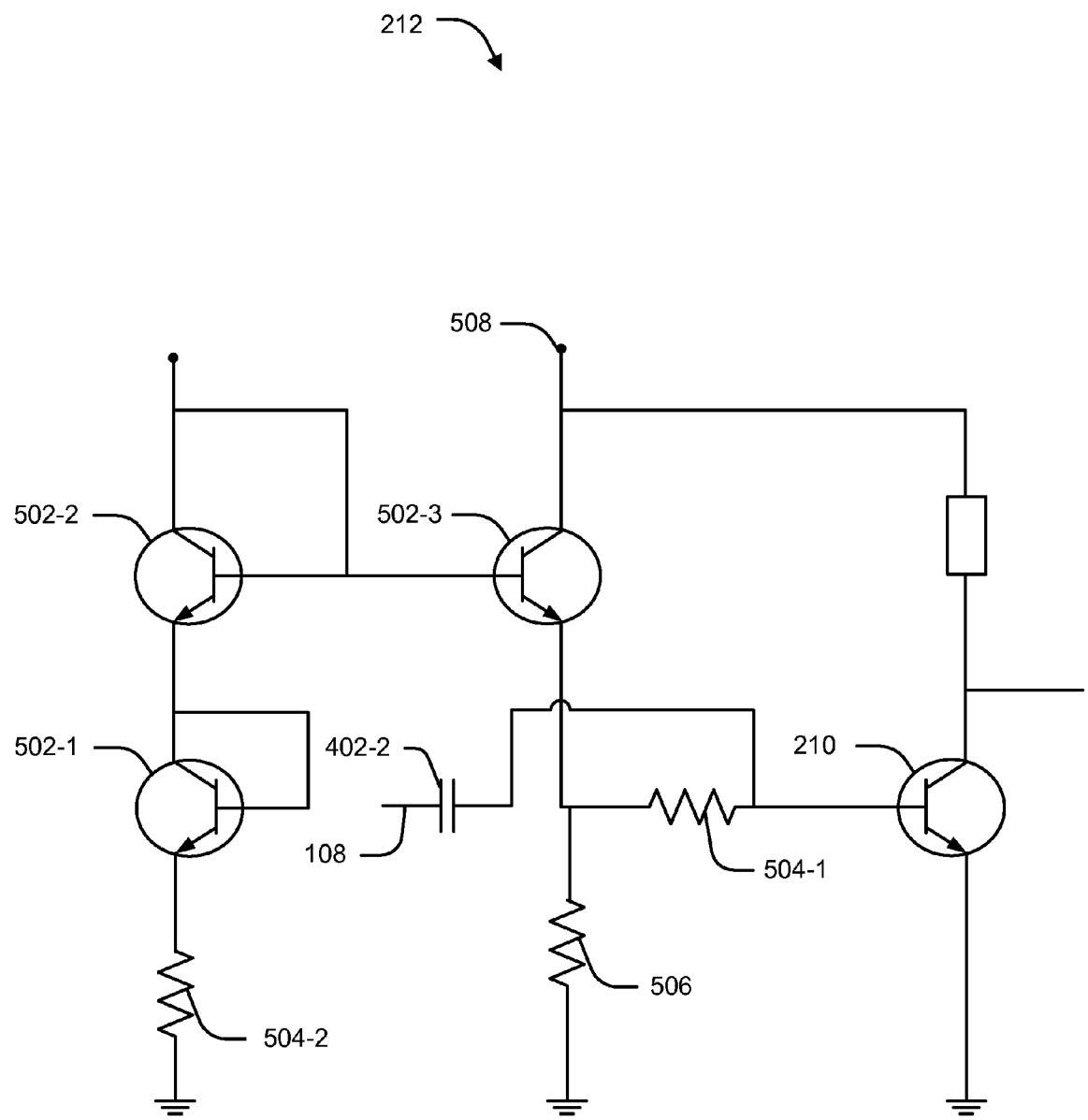
FIG. 5 is a block diagram illustrating an exemplary current biasing circuit.

FIG. 5 illustrates an exemplary variable current source 212. The stage2 210 and the stage3 214 of the power amplifier 110 control the output power by current regulation. To this end, the variable current source 212 provides a variable bias current per operating requirements, for the stage2 210 and the stage3 214. The stage2 210 and the stage3 214 can either derive the variable bias current from two different variable bias current circuits, or from a single variable bias current circuit. In the following description, the variable current source 212 is described in reference to the stage2 210 of the power amplifier 110; however, it will be understood that a similar circuit can be used at the stage3 214 of the power amplifier 110.

The variable current source 212 includes a current mirror realized between an NPN transistor 502-1, which may be diode connected, and the transistor in the stage2 210. In an implementation, the threshold voltage of the diode-connected transistor 502-1 is higher than that of the current mirror. The current mirror is implemented by NPN transistors 502-2 and 502-3. In an implementation, the transistors 502-1, 502-2, and 502-3 can be N-channel MOSFETs.

In another implementation, when the stage2 210 receives the RF signal 108 from the stage1 202 via the coupling capacitor 402-2, a current flows from the transistor 502-2 of the current mirror to the stage2-210. The current introduced by the current mirror is relatively small compared to the RF signal 108. A RF block resistor 504-1 preceding the stage2 210 is small enough to allow the stage2 210 to obtain optimal breakthrough voltage conditions. The RF block resistor 504-1 blocks the RF signal 108 to avoid electric diffusion of the RF signal 108 in the current mirror. If the voltage associated with the RF signal 108 is higher than the voltage of the variable current source 212, the output power of the stage2 210 may be determined by the RF signal 108. A resistor 504-2 in the emitter terminal of the diode-connected transistor 502-1, may be used to achieve a correct current mirror factor and correlates with the resistor 504-1 and the beta of the transistors. The transistor 502-3 in the circuit may grounded via a "decharge" resistor 506.

Exemplary Method

Figure 6:
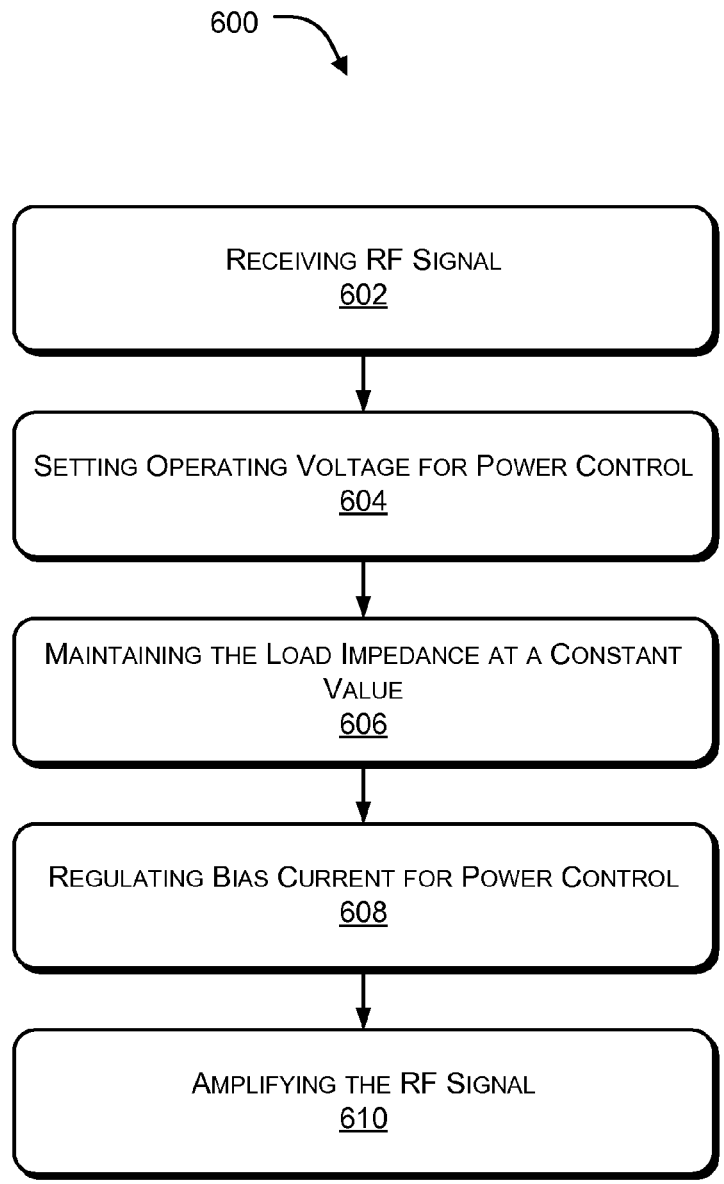
FIG. 6 is a flowchart illustrating an exemplary method for power control in a power amplifier.

FIG. 6 illustrates an exemplary method 600 for output power control in a power amplifier. The order in which the method is described is not intended to be construed as a limitation, and any number of the described method blocks can be combined in any order to implement the method, or alternate method. Additionally, individual blocks may be deleted from the method without departing from the spirit and scope of the subject matter described herein.

The method introduced may, but need not, be implemented at least partially in architecture(s) such as shown in FIGS. 1-5. In addition, it is to be appreciated that certain acts in the methods need not be performed in the order described, may be modified, and/or may be omitted entirely. Furthermore, the method can be implemented in any suitable hardware, software, firmware, or a combination thereof, without departing from the scope of the invention.

At block 602, an RF signal is received as input. For example, the power amplifier 110 in a mobile communication device such as a cell phone may receive the input signal 102 for amplification, which is modulated into the RF signal 108 and amplified as per operating requirement. For example, GSM specifications list nominal output power levels, and accepted tolerances of GSM mobile transmitters under various operating conditions. The power amplifier 110 can be responsible for providing power efficiency to the RF signal 108. Therefore, output power of the power amplifier 110 may be controlled to meet the operating requirement.

At block 604, operating voltage is set for power control. In one implementation, the power amplifier 110 includes multiple stages for amplification of the RF signal 108. Each stage can include electronic components, such as transistors. The stage1 202 controls the output power by voltage regulation. The stage1 202 regulates the operating voltage as dictated by the control voltage 206. The control voltage 206 drives the base terminal of the NPN transistor 302. In one implementation, an N-channel MOSFET can be used in place of the NPN transistor 302. The emitter terminal of the NPN transistor 302 can be connected to the transistor in the stage1 202. The collector terminal of the NPN transistor 302 can be connected to a DC source 304 for biasing of the NPN transistor 302. The operating voltage of the stage1 202 is regulated with the help of the transistor 302. This approach is applicable to the systems, such as GSM, where the transistor in the stage1 202 operates in the saturated mode. In systems such as EDGE, the transistor may operate in the linear mode, and the approach for voltage regulation as described above may not be applicable. In one implementation, for systems that make use of operation of the transistor in the linear mode, the variable gain amplifier 306 can be used. The output power is dependent on the gain of the variable gain amplifier 306. The gain of the variable gain amplifier 306 can be adjusted as required. The variable gain amplifier 306 can be implemented using transistors, operational amplifiers, and the like.

At block 606, load impedance is maintained at a constant value. In one implementation, the output power of stage1 202 varies with a change in the load impedance of the transistor in stage1 202. The load impedance may also vary if noise or interference is received from the antenna 114. In an implementation, to avoid variations in the load impedance, the isolating device 208 may be introduced in the signal path from the stage1 202 to the next stage. The isolating device 208 is a directional coupler that couples the power from the stage1 202 to the next stage, but isolates the stage1 202 from the noise coming from the antenna 114 and other stages of the power amplifier 110. Therefore, the isolating device 208 prevents any variation in the load impedance due to retroactivity. The isolating device 208 can be implemented with the help of passive electronic components such as inductors, transformers, 90° Hybrids, or an insulating material. In an alternate embodiment, forced adjustments can also be made in the load impedance to keep it at a constant value.

At block 608, bias current is regulated for power control. In one implementation, at the stage2 210 and stage3 214, the power control is performed by current regulation. Stage2 210 and stage3 214 can include electronic components such as transistors. The stage2 210 and the stage3 214 receive a variable bias current by the variable current sources 212-1 and 212-2, respectively. In an implementation, the bias current can be obtained from a common variable current source 212. In addition, the control voltage 206 dictates the output of the variable current source 212. Depending upon the control voltage 206, the variable current source 212 regulates the bias current for the stage2 210 and the stage3 214.

At block 610, the RF signal is amplified. In an implementation, the RF signal 108 gets amplified through various stages in the power amplifier 110, with output power of the power amplifier 110 being controlled via voltage as well as current regulation. The amplified RF signal 112 is transmitted via the antenna 114.

CONCLUSION

Although embodiments for power amplifier with output power control have been described in language specific to structural features and/or methods, it is to be understood that the appended claims are not necessarily limited to the specific features or methods described. Rather, the specific features and methods are disclosed as exemplary implementations for power amplifier with output power control.

What is claimed is:

1. A power amplifier comprising:
   a first stage that receives a radio frequency (RF) signal, which controls power by voltage regulation, and outputs power based on an operating voltage;
   a voltage regulator that regulates the operating voltage and compares the operating voltage with a control voltage and changes the operating voltage, if there is a difference between the operating voltage and the control voltage;
   an isolating device that couples power from the first stage, wherein the isolating device isolates the first stage from signals other than the RF signal and is a hybrid coupler; and
   a second stage that receives the coupled power from the isolating device.

2. The power amplifier of claim 1, wherein the first stage provides an output power that varies with a change in load impedance of components in the first stage.

3. The power amplifier of claim 1, wherein the second stage receives a variable bias current from a variable current source.

4. The power amplifier of claim 1 further comprising a third stage that receives output from the second stage, and further amplifies the output, wherein the third stage receives a variable bias current.

5. The power amplifier of claim 4, wherein the second and third stage receive variable bias current from a variable current source.

6. The power amplifier of claim 1 further comprising a detector that measures power efficiency of an output of the power amplifier.

7. An apparatus comprising:
   a pre-amplifier that receives an input signal and amplifies the input signal;
   a radio frequency (RF) modulator that converts the input signal to an RF signal; and
   a power amplifier that increases the efficiency of the RF signal, comprised of:
   a) multiple stages for signal amplification, wherein power control in a first stage is achieved by voltage regulation, and power control in following stages is performed by current regulation;
   b) an isolating device that maintains load impedance of the first stage by preventing return signals in a transmission path to the first stage.

8. The apparatus of claim 7, wherein the pre-amplifier includes a buffer to receive the input signal.

9. The apparatus of claim 7, wherein the first stage in the power amplifier includes transistors operating in saturation region, and output power in the first stage is controlled by voltage regulation.

10. The apparatus of claim 7, wherein the first stage in the power amplifier includes transistors operating in linear region, and output power in the first stage is controlled based on the mode of operation of the first stage.

11. The apparatus of claim 7, wherein the power amplifier includes a coupling capacitor that blocks DC signals to the first stage.

12. The apparatus of claim 7, wherein the power amplifier includes a second stage that includes a transistor with load impedance for amplification.

13. The apparatus of claim 7, wherein stages following the first stage, receive variable bias current from a variable current source.

14. A method for output power control in a power amplifier comprising:
   receiving a radio frequency (RF) signal at a first stage;
   setting an operating voltage of the power amplifier at the first stage;
   maintaining a constant load impedance at the first stage, the maintaining the constant load impedance includes isolating interference to the first stage by preventing return signals in a transmission path to the first stage; and
   regulating a bias current at stages following the first stage.

15. The method of claim 14, wherein the receiving the RF signal includes amplifying the RF signal based on one or more operating requirements.

16. The method of claim 14, wherein the setting of the operating voltage is dictated by a control voltage in the first stage.

17. The method of claim 14, wherein the maintaining a constant load impedance includes isolating noise to the first stage.

18. The method of claim 14, wherein the regulating of the bias current is from a common variable current source.

19. The method of claim 14 further comprising amplifying the RF signal at one or more of the stages.

* * * * *